United States Patent

Lund

[11] Patent Number: 6,069,360
[45] Date of Patent: May 30, 2000

[54] METHOD AND APPARATUS FOR ELECTRON-ONLY RADIATION DETECTORS FROM SEMICONDUCTOR MATERIALS

[76] Inventor: James C. Lund, 429 Warwick Ave., San Leandro, Calif. 94577

[21] Appl. No.: 09/075,419

[22] Filed: May 8, 1998

[51] Int. Cl.[7] .......................... H01L 31/0224; G01T 1/24
[52] U.S. Cl. .............................. 250/370.01; 250/370.13; 250/370.12; 250/370.06; 250/389; 257/428
[58] Field of Search ..................... 250/370.01, 370.11, 250/370.12, 370.13, 371, 389; 257/428, 431, 429, 430

[56] References Cited

U.S. PATENT DOCUMENTS

| | | | |
|---|---|---|---|
| 4,253,023 | 2/1981 | Whited | 250/370 |
| 4,996,432 | 2/1991 | Saituo et al. | 250/370 |
| 5,391,882 | 2/1995 | Righer | 250/370.13 |
| 5,530,249 | 6/1996 | Luke | 250/374 |
| 5,627,377 | 5/1997 | Hamilton et al. | 250/370 |
| 5,677,539 | 10/1997 | Apotovsky et al. | 250/370 |
| 5,821,539 | 10/1998 | Matz et al. | 250/370.01 |
| 5,905,264 | 5/1999 | Shahar et al. | 250/370.01 |

OTHER PUBLICATIONS

Nonprovisional U.S.Patent Application entitled "High–Resolution Ionization Detector and Array of Such Detectors" MacGregor, Douglas S., and Rojeski, Ronald A., filed May 8, 1998 (not included herein JPS May 8, 1998) 09/075,351.

Butler, J.F., "Novel electrode design for single–carrier charge collection in semiconductor nuclear radiation detectors" Nuclear Instruments and Methods in Physics Research, A 396 (1997) pp. 427–430.

Luke, P.N., "Unipolar Charge Sensing with Coplanar Electrodes–Application to Semiconductor Detectors" IEEE Trans. On Nucl. Sci., vol. 42, No.4, Aug. 1995, pp. 207–213.

Barrett, H.H., Eskin, J.D., Barber, H.B., "Charge Transport in Arrays of Semiconductor Gamma–Ray Detectors" Physical Review Letters, vol. 75, No. 1, Jul. 1995, pp.156–159.

Luke, P.N., "Single–polarity charge sensing in ionization detectors using coplanar electrodes" Appl. Phys. Lett., vol. 65, No. 22, Nov. 1994, pp. 2884–2886.

Doty, F.P., Barber, H.B., Augustine, F.L., Butler, J.F., Apotovsky, B.A., Young, E.T., Hamilton, W., "Pixellated CdZnTe detector arrays" Nuclear Instruments and Methods in Physics Reserch, A 353 (1994) pp. 356–360.

Gatti, E., Rehak, P., "Semiconductor Drift Chamber– An Application of a Novel Charge Transport Scheme" Nuclear Instruments and Methods in Physics Research, 225 (1984) pp. 608–614.

*Primary Examiner*—Constantine Hannaher
*Assistant Examiner*—Albert Gagliardi
*Attorney, Agent, or Firm*—Timothy Evans

[57] ABSTRACT

A system for obtaining improved resolution in room temperature semiconductor radiation detectors such as CdZnTe and $HgI_2$, which exhibit significant hole-trapping. A electrical reference plane is established about the perimeter of a semiconductor crystal and disposed intermediately between two oppositely biased end electrodes. The intermediate reference plane comprises a narrow strip of wire in electrical contact with the surface of the crystal, biased at a potential between the end electrode potentials and serving as an auxiliary electrical reference for a chosen electrode—typically the collector electrode for the more mobile charge carrier. This arrangement eliminates the interfering effects of the less mobile carriers as these are gathered by their electrode collector.

13 Claims, 4 Drawing Sheets

METHOD AND APPARATUS FOR ELECTRON-ONLY RADIATION DETECTORS FROM SEMICONDUCTOR MATERIALS

STATEMENT OF GOVERNMENT INTEREST

This invention was made with Government support under contract no. DE-AC04-94AL85000 awarded by the U. S. Department of Energy to Sandia Corporation. The Government has certain rights in this invention.

BACKGROUND OF THE INVENTION

Semiconductors are materials which exhibit a band gap between the material's valence and conduction bands, typically no more than a few eV. Because this energy gap is so low, as the temperature of the crystal is increased, electrons are thermally excited and easily from the valance band to the conduction band. The electrical properties of these materials, therefore, are effected not only by the movement of electrons into the conduction band but also by the formation of vacant sites or "holes" in the valence bands left behind by the departing electrons. Both can conduct current.

Holes also may be created by the interaction of energetic radiation, such as X-rays, gamma rays, and the like, with intrinsic semiconductors and, therefore, one should be able to use these materials as detectors for measuring high energy radiation. In fact, high-resistivity semiconductor radiation detectors are widely used for detecting ionizing radiation due to their ability to operate at room temperature, their small size and durability. Such detectors are used in a wide variety of applications, including medical diagnostic imaging, nuclear waste monitoring, industrial process monitoring, and space astronomy. Ionizing radiation includes both particulate radiation, such as alpha or beta particles, and electromagnetic radiation, such as gamma or x rays.

If all the electrons and holes generated by the ionizing radiation reach their respective electrodes (i.e., the electrons reach the anode and the holes reach the cathode), the output charge signal will exactly equal the charge from the energy deposited within the crystal by the radiation. Because the deposited charge is directly proportional to the energy of the ionizing radiation, the semiconductor detector provides a means for measuring the energy of the ionizing radiation.

Room temperature detectors, however, suffer from a serious drawback. Because of limitation in the transport properties of the bulk semiconductor crystal, some of the electrons and, more particularly, some holes are generally lost by being trapped as they move toward the respective electrodes under the influence of the external electrical field. This is particularly evident for semiconductors wherein the transport properties of one carrier type (e.g., electrons) are much better than those of another type (in this example the "holes"). Under such circumstance, therefore, the amplitude of the output charge signal becomes dependent on the position within the crystal at which the ionizing radiation is absorbed. Generally speaking, the amplitude is less than the charge deposited by the ionizing radiation and results in a corresponding reduction of energy measurement accuracy, poor resolution, and reduced peak efficiency.

This loss (or trapping) of charge in a radiation detector results in distorted and asymmetrical spectral peak shapes known as "hole tailing."

The inability to eliminate "hole" drift current is a major impediment for the use of room temperature semiconductors as detectors. Gamma-ray spectroscopy is particularly encumbered because pulse height spectra produced by these devices are distorted by this process in a way best explained by the illustration in FIG. 1. Here, mono-energetic gamma rays 1–3 interact with positions 4–6 producing charge signal responses of different height because the total distance drifted by each charge is different in all three cases. This phenomenon is well known in the prior art and has been described by many researchers. It is widely understood to be the major deficiency limiting the effectiveness of room temperature semi-conductor materials, such as $Cd_{1-x}Zn_xTe$ and $HgI_2$, used as gamma-ray detectors.

This invention, therefore, pertains generally to a method for constructing a simple room-temperature, semiconductor device for detecting gamma radiation. More particularly, this invention pertains to a method and an apparatus which completely, or nearly completely, suppresses spurious signal currents arising from hole drift or "hole-tailing."

DESCRIPTION OF THE PRIOR ART

As previously stated, because of the deleterious effects of hole-tailing in semiconductor detectors, much effort has gone into attempting to solve this problem. U.S. Pat. Nos. 4,253,023 and 4,996,432 recognized the problem and proposed early remedies. The first of these included a method to de-convolute the contribution of electron from the acquired signal. The second approach proposes a method relying upon use of a thick crystal and a crystal orientation placing the detector anode surface facing the source of radiation thereby reducing the positional dependence of the radiation interaction with the crystal and restricting it only to that part of the crystal immediately behind the anode. Neither of these approaches directly addresses the problem of eliminating hole-tailing.

U.S Pat. No. 5,677,539 provides another approach and a comprehensive review of much of the pertinent prior art. A particularly relevant approach, described therein, employs an anode patterned into an interleaving grid structure, with the cathode remaining planar. (See, e.g., P. N. Luke, "Unipolar Charge Sensing with Coplanar Electrodes-Application to Semiconductor Detectors," IEEE Tran. Nucl. Science, vol. 42, No. 4, at pages 207–213 (1995)). In this approach, one set of anode grids is maintained at a slightly higher voltage than the other. A train of signal conditioning electronics is connected to each set of grids, and the difference between the outputs from these trains constitutes the final output signal. With this arrangement, when the charge cloud is far from the grids, the difference-signal between the grid outputs is zero. As the cloud approaches the grids, the induced charge on one grid rises rapidly, while the charge induced in the other grid drops rapidly. The difference signal is then a measure of the full charge in the electron cloud, independent of the position of the ionizing event.

This approach, however, also suffers from various drawbacks. First, the grid structure is relatively complex and would be difficult, if not impossible, to use in detector arrays. Second, the grids require two separate amplifying chains, plus a difference amplifier, adding significantly to the complexity and cost of manufacture. This circuitry also would be difficult to implement in the multichannel type integrated circuits needed in detector array structures.

A relatively simpler structure is a variation on a technique devised by Frisch for use in gas detectors. The hole tailing phenomenon observed in semiconductor detectors is analogous to the trapping behavior of positive ions in gas detectors. Frisch proposed, and later developed, detectors which contained a grid of conductive wires between the two electrodes of a conventional gas detector. An illustration of the Frisch grid structure is shown in FIG. 2.

In the Frisch grid type detector, the signal is measured between the anode and the grid. The negative charge carriers, electrons in the case of a semiconductor detector, usually drift all of the way to the anode. Thus, any radiation interactions occurring between the cathode and the grid will produce electrons that drift past the grid and on to the anode. When the electrons drift across the gap between the grid and the anode, they will induce a current which is due solely to the motion of electrons. The current induced by positively charge carriers ("holes" in the case of semiconductors) traveling in the opposite direction is shielded by the grid. The main advantage, then, of the Frisch grid is that the signal produced from the device is independent of the position of interaction between the cathode and grid (completely solving the hole tailing problem in the cathode to grid region).

An approach to reducing hole-tailing in a semiconductor detector using a modified Frisch grid approach was personally described to the author by D. S. McGregor during his employment at the Sandia National Laboratories California site (SNUCA). McGregor's scheme, described as an "etch trench" device, entailed building a Frisch Grid device on a semiconductor crystal and placing electrodes at the bottom of these trenches. A diagram of McGregor's device—as the author understands it—is shown in FIG. 3.

The primary disadvantage of McGregor's etch-trench design is that it is difficult to execute. In other words, it might be very difficult to produce the requisite trenches, particularly since the fabrication technology for room temperature semiconductor materials is not well developed at this time. Therefore, while a Frisch-grid type device design would work very well in a room temperature semiconductor detector, it suffers form the fundamental drawback of being difficult to construct. Such a device, owing to the difficulty of placing a conductive grid inside a semiconductor crystal would be inherently complex and expensive.

Finally, a third approach is discussed in U.S. Pat. No. 5,677,539. This invention takes advantage of the principle that a significant reduction in tailing in a semiconductor detector can be attained by a novel arrangement of electrodes that share induced charge from ionizing events in the detector, that properly shape the electric field, and that focus charge collection toward a small electrode.

The detector includes three electrodes formed on the surface of a semiconductor crystal. The crystal has a plurality of sides; it preferably has a thickness of at least about 0.5 mm and is preferably formed from a semiconductor material having a high mobility-lifetime ratio (one charge carrier having a greater mobility than the other). The first electrode is a bias electrode, which preferably covers the entire surface of one side of the crystal. At least one signal electrode having a small area is preferably formed on the opposing side of the crystal from the bias electrode. A control electrode is preferably disposed on the same side containing the signal electrode.

In particular, in this invention, the control electrode is formed on the same side of the semiconductor crystal as the signal electrode (anode), and the bias electrode (cathode) covers substantially the entire surface of the opposite side of the crystal. The semiconductor crystal is formed from CdZnTe or CdTe. In the simplest configuration, the anode is a small contact point located near the center of the electron-charge-collection side of the crystal. The anode is coupled to ground through a large-value resistor and to external signal circuitry. The cathode is coupled to a voltage source that maintains the cathode at a negative voltage level relative to the anode. Preferably, the control electrode is much larger in area than the anode and forms a single ring surrounding the anode. The control electrode is maintained at a voltage level that is negative with respect to the anode, but generally not more negative than the cathode.

This approach relies on a geometric construction of the various electrodes to shape the electric field within the crystal in order to direct and accelerate the more mobile of the charge carriers toward the appropriate collecting electrode. By operating in this manner the less mobile of the charge carriers, those which are "trapped", arrive typically too late to contribute to the analysis. However, while much reduced, some small percentage of these carriers still do contribute to the signal.

Each of the foregoing examples, therefore, exhibits some shortcoming which tends to warrant its use less attractive. What is needed is a semiconductor radiation detector that minimizes tailing and that obviates the disadvantages and drawbacks resident in conventional radiation detectors.

The present invention provides such a radiation detector.

SUMMARY OF THE INVENTION

The principle object of the instant invention, generally, is to provide a means for eliminating the effects of "hole tailing" in room temperature semiconductors radiation detectors. More particularly, the principle object of this instant invention is to provide a method for constructing an electron-only, unipolar, radiation detector.

It is another object of this invention to provide a room temperature, solid-state detector which is selectively sensitive to individual photons of electromagnetic radiation, and which exhibits little or no distortion of the energy spectrum.

Still another object of this invention to provide a device having an ancillary electrode arrangement such that the charge induced by the motion of holes, in a semiconductor under the influence of an externally applied electrical field, is blocked.

Yet another object of this invention is a method for eliminating or greatly suppressing the deleterious effects of "hole-tailing" exhibited by conventional room temperature semiconductors and the associated degradation of observed spectral peaks when these semiconductors are used as detectors for gamma-ray spectroscopy.

Another object of this invention is to provide a gamma ray detector comprising a room temperature semiconductor having at least one opposing lateral contact.

DETAILED DESCRIPTION OF PREFERRED EMBODIMENT

Figure 4A:
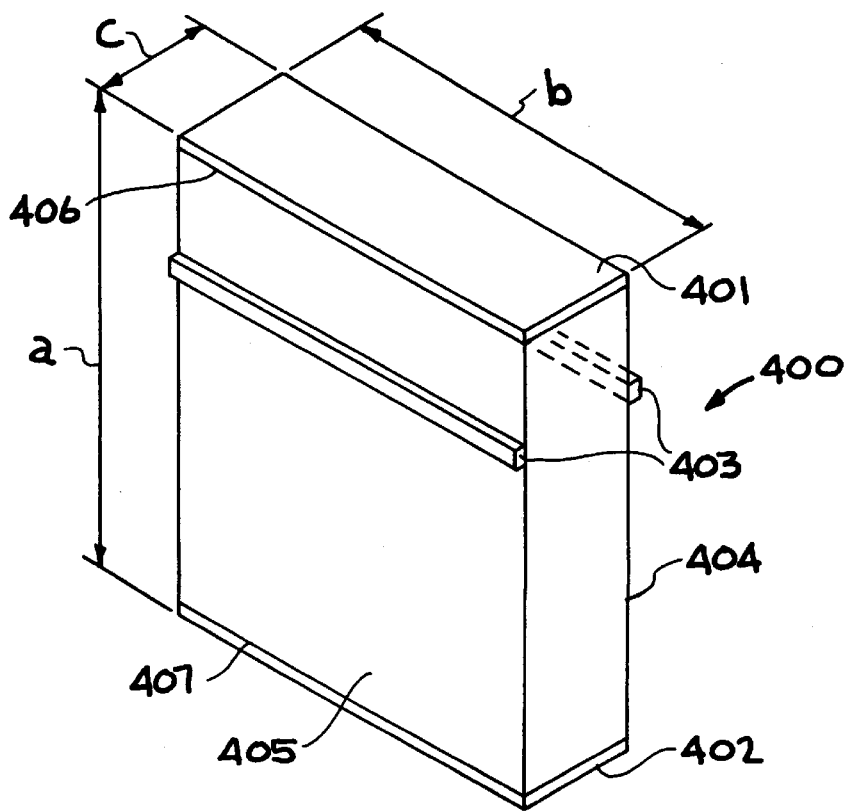
FIGS. 4A,C show representative cartoons of the device of the instant invention.
Figure 4B:
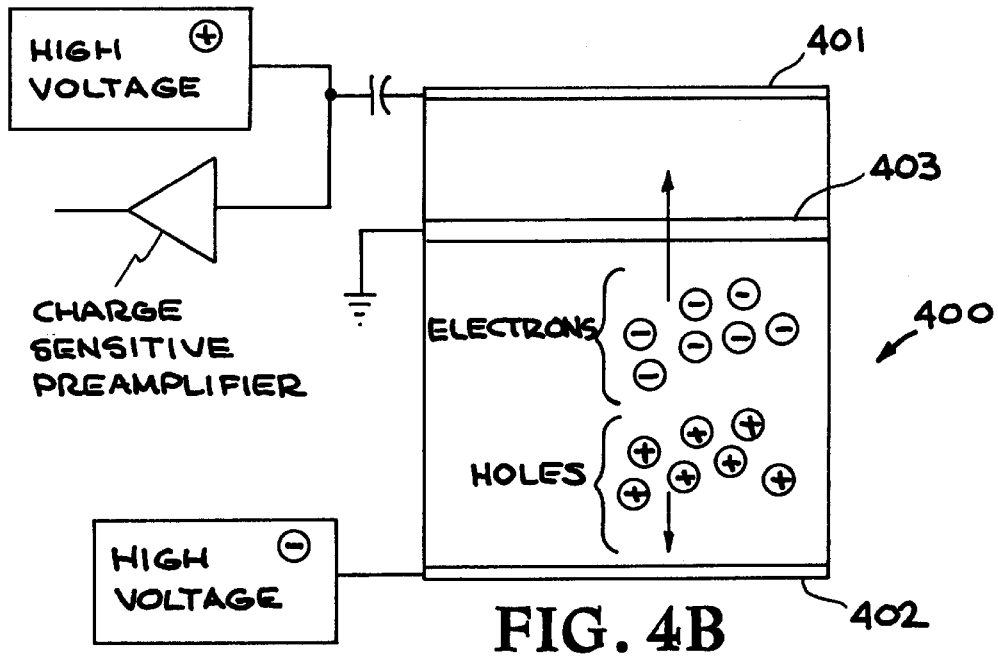
FIG. 4B shows an idealized representation of the operation of the new device.

A new method for constructing an electron-only (unipolar) radiation detector has been conceived. FIG. 4A shows a perspective view of this new design in its simplest form. The detector crystal 400, consists of a piece of semiconducting material in the form of a rectangular parallelepiped with electrical contacts, or electrodes, placed on two opposing faces (anode 401 and cathode 402) as with any conventional detector. In addition to electrodes 401 and 402 on opposing faces, there are lateral contacts 403 placed on the lateral faces 404 and 405 (faces at right angles to anode and cathode contacts). Lateral contacts 403 serve to block charge induction from the motion of holes, serving much the same function as the grid in a Frisch Grid type gas detector. FIG. 4B illustrates the operation of the new device shown in FIG. 4A. Alternatively, there may be a single lateral contact spanning the perimeter of the crystal.

The reader will noted that FIG. 4A shows a perspective view of the preferred embodiment of a single-element detector 400 of the present invention, only. While a single-element detector is shown, it is to be understood that the detector of the present invention is not necessarily limited to a single-element embodiment and can be used in any multi-element configuration. Thus, a number of single-element detectors 400 could be grouped together to form an array of single-element detectors.

In order to demonstrate the new unipolar device concept described supra, a detector was fabricated using these new design principles. The physical characteristics and construction of the detector of the present invention are as follows below. For the following discussion, it is implied that the mobility for electrons is greater than for holes. One skilled in the art will recognize that, for the reverse condition, in which the mobility for holes is greater than that for electrons, the electric polarity would be reversed.

A. The Semiconductor Crystal

The semiconductor crystal 400 is a slab of high-resistivity semiconductor material. Preferably, the crystal consists of a slab of high-resistivity CdZnTe, which can operate at room temperature and can be fabricated into detectors. Alternatively, the crystal 400 may be formed from CdTe, $HgI_2$, PbI, or any other semiconductor material having a high-resistivity and that can be fabricated into detectors.

As shown in FIG. 4, the semiconductor crystal 400, is preferably a rectangular parallelepiped, a right cylindrical rod, or a long prism or any other generally rhombohedral shape. The crystal may, however, have virtually any desired geometric shape so long as it is possible to establish a measurement pair comprising at least one lateral contact 403 and one electrode 401 or 402. In one experimental embodiment, crystal 400 was cut to have side with dimensions "a", "b" and "c" being about 10 mm×10 mm×2 mm. It should be understood, however, that the dimensions of FIG. 4 and the materials herein described are merely exemplary and that parameters of the device depend primarily on the application in which the detector is being used and on the measurement conditions.

B. Anode and Cathode Electrodes

Electrodes 401 and 402 are formed as conductive layers and applied by either plating a metallized coating, or preferably by vapor deposition. In the present invention the crystal 400 was coated by vacuum on substantially the entirety of the surface of ends 406 and 407 of crystal 400. In the preferred embodiment, as shown in FIG. 4A, anode 401 and cathode 402 are applied to opposite ends of crystal 400 across the height "a" of the crystal. Preferably gold is used as the conductor although any metallic conductor having a low specific resistivity is, in principle, capable of operating as an electrode material.

Figure 5:
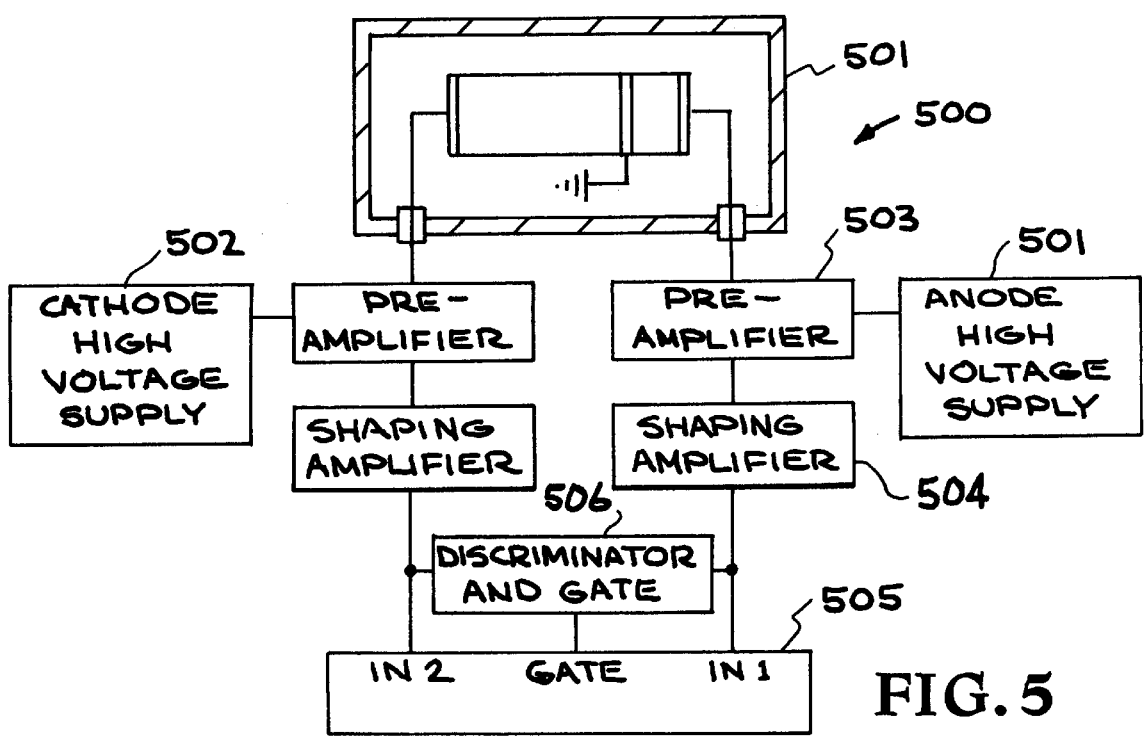
FIG. 5 shows an electrical schematic of the apparatus used to test the device of this invention.

Anode 401 and cathode 402 are operated with independent high voltage sources as seen in FIG. 5. Cathode 402 voltage, $V_-$, is set negative with respect to anode 401. For the preferred embodiment, in which the crystal 400 is about 2 mm thick, the magnitude of $V_-$ is set to about −1000 volts, and the magnitude of anode voltage $V_+$, is set to about +275 volts. However, it should be understood that $V_-$ and $V_+$, may be any suitable voltage level commensurate with the specific device configuration.

The embodiment described herein is configured under the assumption that the mobility of electrons is greater than that of hole, and the electrode 402 acts as a cathode. This arrangement will be referred to as such throughout the remainder of this description. If, however, the mobility of each specie were reversed, the polarity would be reversed, and the cathode 402 would act as an anode.

Preferably, both anode 401 and cathode 402 are coupled to each respective voltage source 501 and 502 via a wire conductor attached to the electrode coating. Any suitable manner of attachment is possible including soldering, welding, gluing with conductive epoxies, and simple surface contact.

C. The Lateral Contacts

In the embodiment of FIG. 4A, lateral contact pair 403 are preferably narrow conductive pads located on opposite facing surfaces 404 and 405. Each pad comprising contact pair 403 is shown running substantially the entire length of each surface 406 and 407, parallel to electrodes 401 and 402. Preferably contact pair 403 are situated substantially nearer to anode 401 than to cathode 402. The pair so formed, i.e., anode 401 and lateral contact 403, comprise a measurement pair. It is, of course, apparent to those skill in this art that the choice of the electrode to form this pair is based on the relative mobility of the charge carriers in this semiconductor crystal. In those cases where the carriers are electrons the anode is chosen. Where the carriers are holes the cathode 402 and lateral contact 403 would form the measurement pair.

Figure 4C:
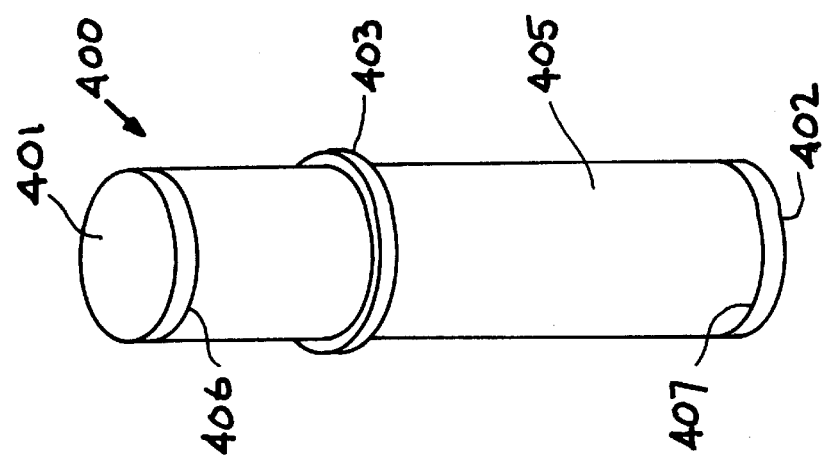

In the present invention preferred embodiment, contacts 403 were placed 2 mm below the anode 401. Nevertheless, those skilled in the art will appreciate that the pair of lateral contacts may be formed in a variety of geometries, provided that the shape of the contact allows it to shield the charge induced by holes moving toward the cathode and provided that it is located such that the likelihood of substantial gamma-ray interaction in the region of the bulk crystal between lateral contact pair and the anode is small. Obvious alternative geometries would consist of a lateral ring contact circumscribing a semiconductor rod, as shown in FIG. 4C. While the rod is shown as a right cylinder it also might be rhombohedral in shape. Regardless, lateral contact 403, is held at ground potential.

Figure 1:
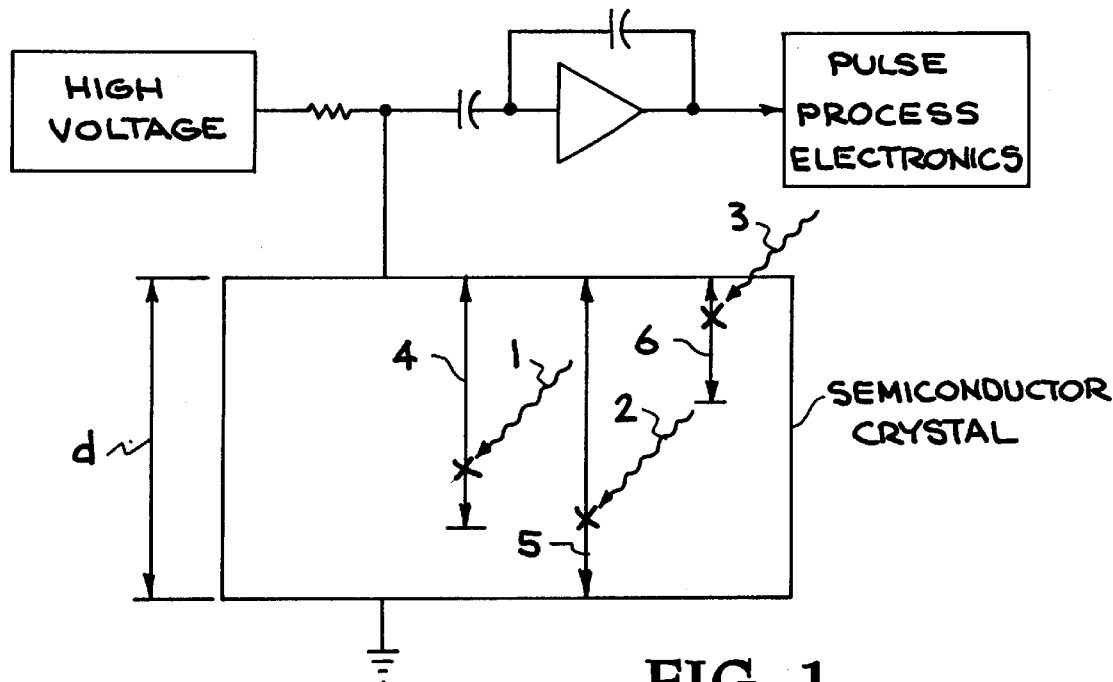
FIG. 1 shows a diagrammatic representation of the interaction of several gamma-rays at several different depths in a semiconductor crystal. Electron/hole pairs are created and some of the holes are subsequently "trapped".
Figure 2:
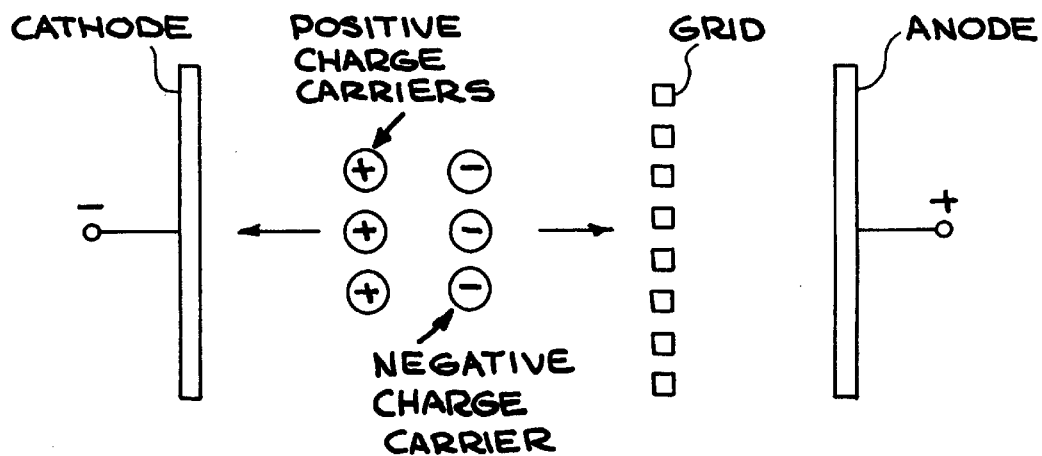
FIG. 2 show a diagram of a Frisch Grid type radiation detector.
Figure 3:
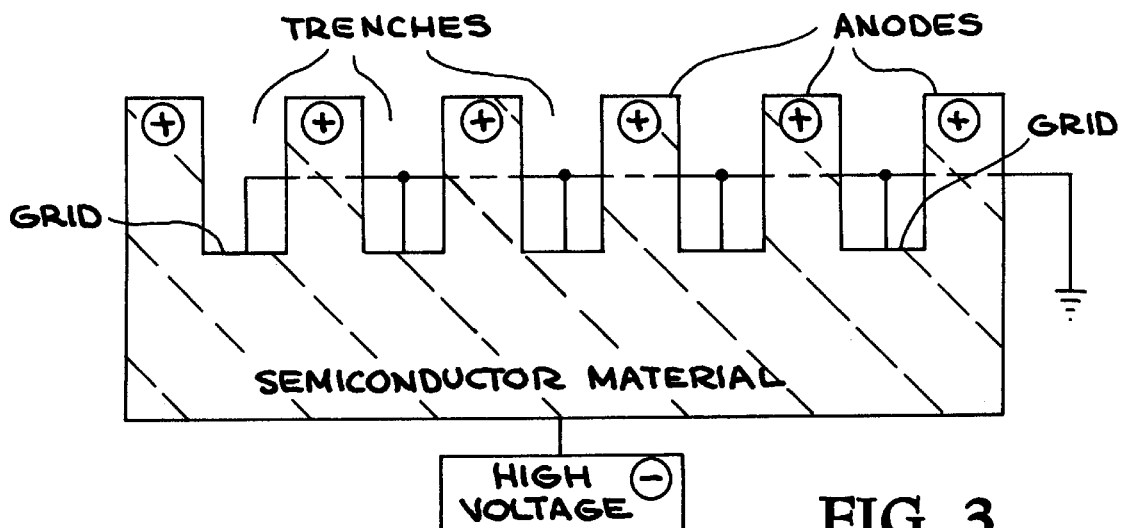
FIG. 3 illustrates an "etched trench" modification to a semiconductor radiation detector in an attempt to incorporate the Frisch Grid concept.

Once again, any radiation interaction occurring in the bulk of the semiconductor 400 will produce electrons that drift past contacts 403 and on to anode 401. When the electrons drift across the gap between the lateral contacts 403 and the anode 401, they will induce a current which is due solely to the motion of electrons. The current induced by holes traveling in the opposite direction is shielded by the grid. A schematic of this behavior is illustrated in FIG. 2.

EXAMPLE OF THE OPERATION OF AN ACTUAL DETECTOR AND GAMMA RAY SPECTROMETER

In order to demonstrate the effectiveness of the method disclosed herein a sample of $Cd_{1-x}Zn_xTe$ having a nominal Zn concentration of 10a/o was obtained from eV Products of Saxonburg, Pa. The sample was 10 mm×10 mm×2 mm and was of the "select counter grade." Gold contacts were applied to the device by vacuum evaporation by RMD, Inc. of Watertown, Mass. Fine gold wires were then applied to the gold contacts using silver epoxy.

The finished device, configured as a spectrometer 500, was placed in a shielded aluminum enclosure 501 and connected to readout electronics shown FIG. 5. Each electrode is attached to a Tennelec TC-170 preamplifier 503. A conventional high voltage power supply 502 is also attached to each electrode, in parallel with the preamplifier. Each preamplifier 503 is itself attached in series to an Ortec 671 shaping amplifier 504 the output of each is attached to the input of an Ortec AD413A analog-to-digital converter (ADC) 505. Finally, the input terminals of a discriminator AND gate 506 are placed across the output of the two shaping amplifiers and the output of the AND gate is attached to the input side of ADC 505.

Figure 6:
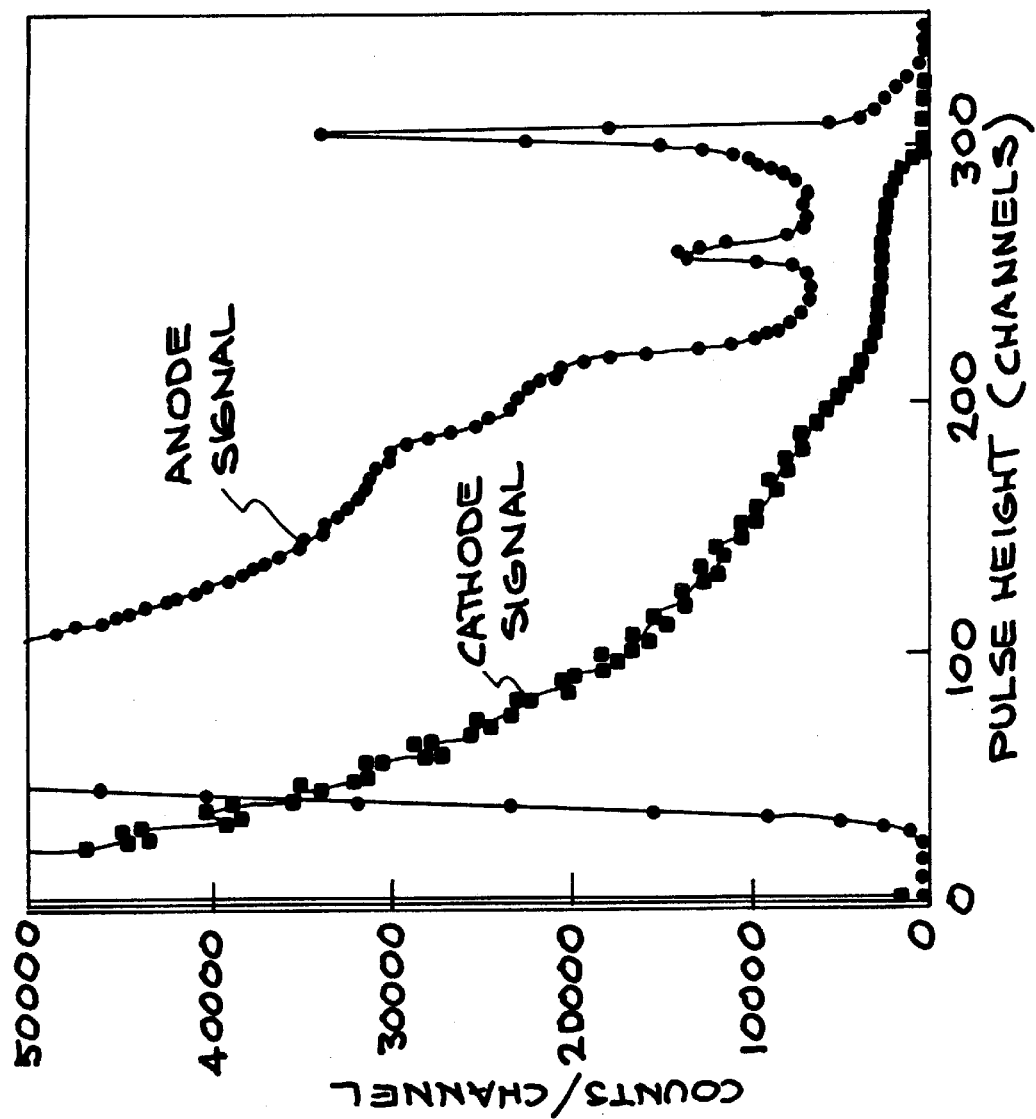
FIG. 6 shows a single pulse height histogram obtained by summing a representative data set taken during the operation of the device of this invention under test.

To test the arrangement, a $^{137}Cs$ source (~10 $\mu$Ci) was placed approximately 1 cm out from the lateral faces 404 or 405. It was found that the detector worked well as a radiation detector when the anode HV supply was set to +275 V and the cathode supply set to −1000 V. Representative data, obtained with the detector configured as shown in FIG. 5, is a two dimensional histogram stored on the Macintosh Quadra 800 in "Kmax" histogram format. Note, in FIG. 5, that the signal from the anode (which corresponds to a unipolar electron signal) is very well defined and clearly shows the photo-peak of $^{137}Cs$. In contrast, the pulse height spectrum from the cathode, data which would be representative signal of both electrons and holes and would, therefore, provide a measure of hole-tailing, shows no clear photo-peak. These data are also shown in FIG. 6. FIG. 6 was obtained by summing all of the anode signal into a single histogram, and all of the cathode signal into another single histogram.

The cathode signal may be viewed as representative of a conventional planar detector. The anode signal utilizes the lateral contact to shield induce charge from the motion of holes and produces a dramatic improvement in the pulse height spectrum thereby demonstrates the feasibility of this concept.

What is claimed is:

1. A device for detecting and measuring an electrical response due to a single charge carrier in a room-temperature semiconductor crystal, the device comprising:
   a high resistivity, semiconductor crystal, said crystal having first and second ends, said crystal having one surface or a plurality of surfaces disposed between said first and second ends, said surface or surfaces having a perimeter;
   a first electrode in electrical contact with said first end, said first electrode biased at a first electrical potential;
   a second electrode in electrical contact with said second end, said second electrode biased at a second electrical potential, said first potential greater than said second potential;
   at least one lateral contact disposed on or about said surface between said first and second ends, said lateral contact in electrical contact with said surface, said lateral contact is biased at a reference potential, said lateral contact and one of said electrodes further comprising a measurement pair.

2. The device of claim 1, further comprising a charge sensitive amplifier, said amplifier electrically attached to the electrode of said measurement pair.

3. The device of claim 2, wherein the semiconductor material is selected from the list consisting of CdZnTe, $Cd_{1-x}Zn_xTe$, wherein x is between about 0.01 and 0.25, $HgI_2$, and CdTe.

4. The device of claim 3, wherein the crystal geometry is roughly cylindrical, rhombohedral, orthorhombic, or cubic.

5. The device of claim 3, wherein the first voltage is preferably between about +800 volts and +200 volts.

6. The device of claim 3, wherein the first electrical potential is most preferably about +275 volts.

7. The device of claim 6, wherein the second electrical potential is about −1000 volts.

8. The device of claim 2, wherein the reference potential of the lateral electrode is lies between said first and second electrical potentials.

9. The device of claim 8, wherein the reference potential is most preferably the ground potential.

10. An ionizing radiation detector comprising the device of claim 2.

11. The detector of claim 10, wherein the semiconductor material is selected from the list consisting of CdZnTe, $Cd_{1-x}Zn_xTe$, wherein x is between about 0.01 and 0.25, $HgI_2$, and CdTe.

12. A gamma ray detector comprising the detector of claim 11.

13. A gamma-ray spectrometer comprising the detector of claim 11, further comprising:
   an aluminum enclosure surrounding said detector;
   first and second preamplifiers;
   first and second high voltage sources;
   first and second shaping amplifiers, said amplifiers having inputs and outputs;
   a logical AND gate, said AND gate having two input leads and a single output lead;
   an analog-to-digital converter, said converter having inputs and outputs;
   said first preamplifier and said first shaping amplifier connected in series between said first electrode and a first input of said analog-to-digital converter, said second preamplifier and said second shaping amplifier connected in series between said second electrodes and a second input of said analog-to-digital converter, said first and second electrodes connected to said first and second two high voltage supplies, respectively, said first and second power supplies connected in parallel with said first and second preamplifiers, each of said AND gate input leads connected across said amplifier output leads, said AND gate output connected to the inputs of said analog-to-digital converter.

* * * * *